United States Patent [19]
Lee et al.

[11] Patent Number: 5,872,061
[45] Date of Patent: Feb. 16, 1999

[54] PLASMA ETCH METHOD FOR FORMING RESIDUE FREE FLUORINE CONTAINING PLASMA ETCHED LAYERS

[75] Inventors: Shing-Long Lee; Chia Shiung Tsai; So Wein Kuo, all of Hsin-Chu, Taiwan

[73] Assignee: Taiwan Semiconductor Manufacturing Company, Ltd., Hsin-Chu, Taiwan

[21] Appl. No.: 958,429

[22] Filed: Oct. 27, 1997

[51] Int. Cl.$^6$ .................................................. H01L 21/302
[52] U.S. Cl. ......................... 438/705; 438/723; 438/725; 134/1.2
[58] Field of Search ............................... 134/1.2; 216/80, 216/81; 438/725, 723, 705

[56] References Cited

PUBLICATIONS

"Oxidative Removal of Photoresist by Oxygen/Freon 116 Discharge Products"; Hannon et al.–J. Elect. Soc.; vol. 131, No. 5 pp. 1164–1169; 1984.
"Reducing Etch Rate of Photoresist During Reactive Ion etching–using Polymer Enhancing Agent to Form Vertical Etched Profiles"; p. D–322; 100; Feb. 10, 1991; Anonymous.
"Impact of Reactive Ion Etching Induced Carbon Contamination on Oxidation of Silicon"; J. Elect. Soc. vol. 143, No. 7, pp. 2378–2387; Tsuchiaki et al; Jul. 1996.

*Primary Examiner*—Benjamin Utech
*Assistant Examiner*—George Goudreau
*Attorney, Agent, or Firm*—George O. Saile; Stephen B. Ackerman; Alek P. Szecsy

[57] ABSTRACT

A method for forming a patterned fluorine containing plasma etched layer within a microelectronics fabrication. There is first provided a substrate employed within a microelectronics fabrication. There is then formed over the substrate a fluorine containing plasma etchable layer. There is then formed upon the fluorine containing plasma etchable layer a patterned photoresist layer. There is then etched through a fluorine containing plasma etching method while employing the patterned photoresist layer as a photoresist etch mask layer the fluorine containing plasma etchable layer to form a patterned fluorine containing plasma etched layer. The patterned fluorine containing plasma etched layer has a fluoropolymer residue layer formed thereupon. The fluorine containing plasma etch method employs a first etchant gas composition comprising a nitrogen trifluoride etchant gas. Finally, there is stripped through an oxygen containing plasma stripping method the patterned photoresist layer and the fluoropolymer residue layer from the patterned fluorine containing plasma etched layer. The oxygen containing plasma stripping method employs a second etchant gas composition comprising a fluorine containing etchant gas and an oxygen containing etchant gas.

14 Claims, 6 Drawing Sheets

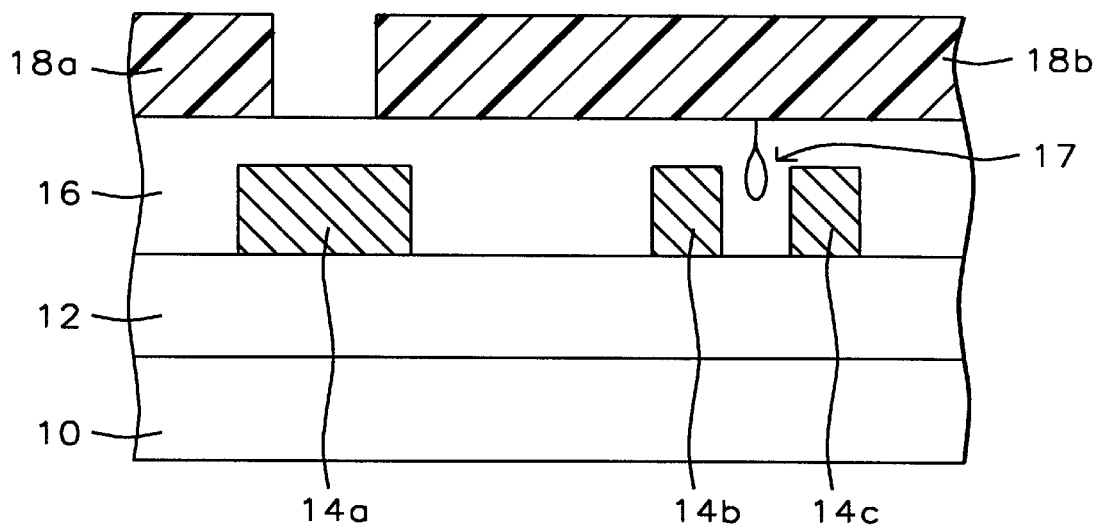
FIG. 1 – Prior Art
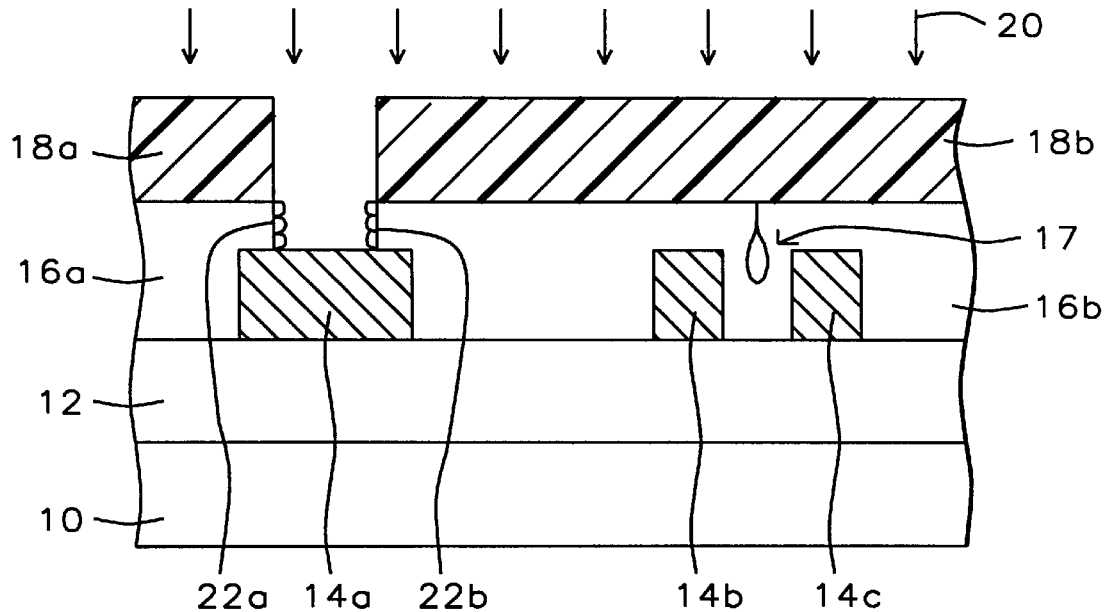
FIG. 2 – Prior Art

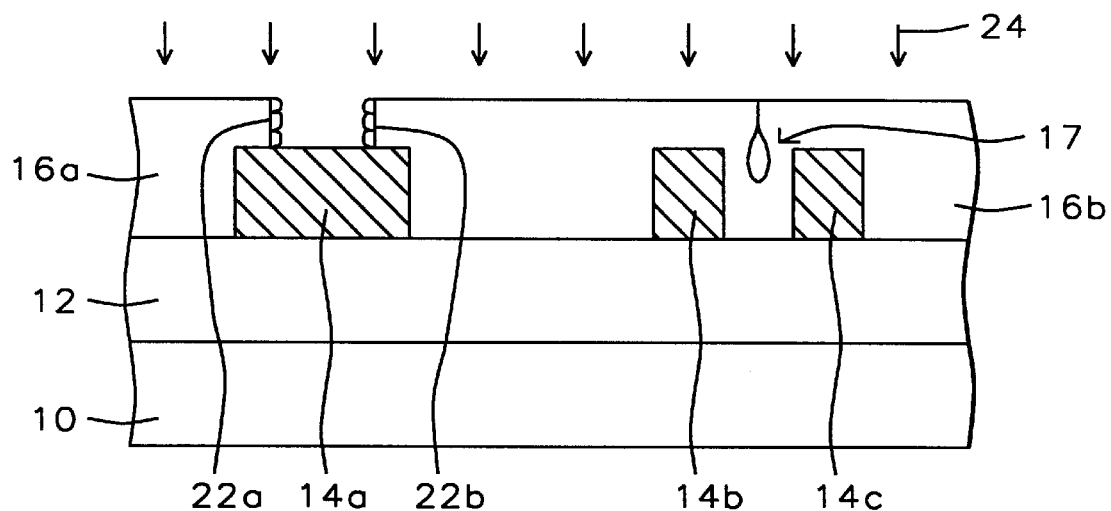
FIG. 3 – Prior Art
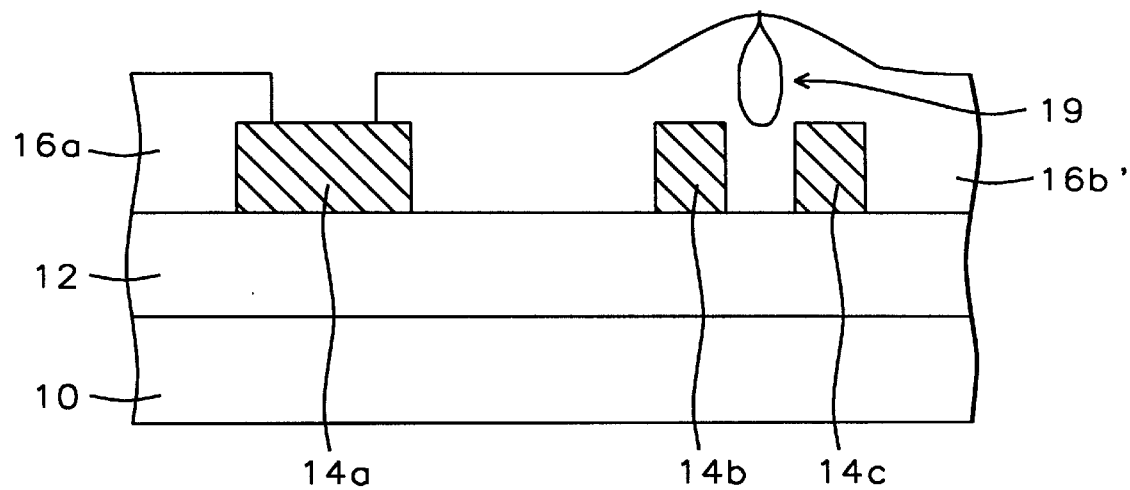
FIG. 4 – Prior Art

5,872,061

PLASMA ETCH METHOD FOR FORMING RESIDUE FREE FLUORINE CONTAINING PLASMA ETCHED LAYERS

BACKGROUND OF THE INVENTION

1. Field of the Invention

The present invention relates generally to methods for forming patterned layers within microelectronics fabrications. More particularly, the present invention relates to fluorine containing plasma etch methods for forming residue free patterned fluorine containing plasma etched layers within microelectronics fabrications.

2. Description of the Related Art

In the process of forming patterned fluorine containing plasma etched layers from corresponding blanket fluorine containing plasma etchable layers within microelectronics fabrications, it is common in the art of microelectronics fabrication to employ: (1) a patterned photoresist etch mask layer to define the patterned fluorine containing plasma etched layer desired to be formed; and (2) a fluorine containing plasma etch method which employs a fluorine containing etchant gas composition employing a fluorine containing etchant gas such as carbon tetrafluoride, trifluoromethane, hexafluoroethane and/or sulfur hexafluoride. Particularly common patterned fluorine containing plasma etched layers which are formed within microelectronics fabrications from corresponding blanket fluorine containing plasma etchable layers within those microelectronics fabrications include patterned fluorine containing plasma etched dielectric layers such as patterned silicon oxide dielectric layers, patterned silicon nitride dielectric layers and patterned silicon oxynitride dielectric layers.

While it is thus common in the art of microelectronics fabrication to form patterned silicon oxide dielectric layers, patterned silicon nitride dielectric layers and patterned silicon oxynitride dielectric layers through fluorine containing plasma etch methods employing patterned photoresist etch mask layers, such patterned dielectric layers are not formed entirely without problems within microelectronics fabrications. In particular, it is known in the art of microelectronics fabrication that when forming patterned fluorine containing plasma etched dielectric layers, such as patterned silicon oxide dielectric layers, patterned silicon nitride dielectric layers and patterned silicon oxynitride dielectric layers, there is commonly formed upon exposed surfaces of those fluorine containing plasma etched dielectric layers fluoropolymer residue layers which are not readily removable within oxygen plasma stripping methods typically employed in stripping from those fluorine containing plasma etched dielectric layers the photoresist etch mask layers employed in defining those fluorine containing plasma etched dielectric layers. Such fluoropolymer residue layers generally incorporate carbon derived from slight etching of photoresist etch mask layers and/or carbon derived from fluorocarbon fluorine containing etchant gases. Such fluoropolymer residue layers are typically subsequently removed from patterned fluorine containing plasma etched dielectric layers through wet chemical stripping methods which unfortunately often contribute to delamination of the fluorine containing plasma etched dielectric layers from the microelectronics fabrications within which they are formed.

A series of schematic cross-sectional diagrams illustrating the results of progressive stages in forming a microelectronics fabrication having formed therein such a fluorine containing plasma etched delaminated dielectric layer is shown within FIG. 1 to FIG. 4. Shown in FIG. 1 is a schematic cross-sectional diagram of the microelectronics fabrication at an early stage in its formation. Shown in FIG. 1 is a substrate 10 having formed thereover a series of patterned conductor layers 14a, 14b and 14c, where the series of patterned conductor layers 14a, 14b and 14c is sandwiched between a first dielectric layer 12 formed upon the substrate 10 and a second dielectric layer 16 formed over the substrate 10. The second dielectric layer 16 has a void 17 (with a seam integral thereto) formed therein interposed between the pair of patterned conductor layers 14b and 14c, such as is commonly encountered when forming dielectric layers, such as the second dielectric layer 16, conformally upon closely spaced microelectronics structures, such as the closely spaced pair of patterned conductor layers 14b and 14c. There is also shown in FIG. 1 formed upon the second dielectric layer 16 a pair of patterned photoresist layers 18a and 18b which expose a portion of the second dielectric layer 16 through which is desired to form a via accessing the patterned conductor layer 14a.

Shown in FIG. 2 is the results of etching through a fluorine containing etching plasma 20 the via through the second dielectric layer 16, thus forming the pair of patterned second dielectric layers 16a and 16b, while simultaneously reaching the patterned conductor layer 14a. As is common in the art of microelectronics fabrication, the fluorine containing etching plasma 20 typically employs an etchant gas composition comprising a fluorine containing etchant gas such as, but not limited to, carbon tetrafluoride, trifluoromethane, hexafluoroethane and/or sulfur hexafluoride. There is also shown in FIG. 2 a pair of fluoropolymer residue layers 22a and 22b formed upon the exposed portions of the patterned second dielectric layers 16a and 16b within the via.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is the results of stripping through an oxygen containing stripping plasma 24 the patterned photoresist layers 18a and 18b from the microelectronics fabrication whose schematic cross-sectional diagram is illustrated in FIG. 2. As is illustrated in FIG. 3, the fluoropolymer residue layers 22a and 22b are typically impervious to the oxygen containing stripping plasma 24 and thus remain upon the via sidewalls defined by the patterned second dielectric layers 16a and 16b. In order to remove the fluoropolymer residue layers 22a and 22b from the corresponding patterned second dielectric layers 16a and 16b it is typically necessary to employ a strong wet chemical stripping solvent such as but not limited to a monoethanolamine wet chemical stripping solvent.

The results of stripping the fluoropolymer residue layers 22a and 22b from the nucroelectronics fabrication whose schematic cross-sectional diagram is illustrated in FIG. 3 is shown by the microelectronics fabrication whose schematic cross-sectional diagram is illustrated in FIG. 4. As is illustrated in FIG. 4, although the fluoropolymer residue layers 22a and 22b have been stripped from microelectronics fabrication whose schematic cross-sectional diagram is illustrated in FIG. 4, the wet chemical stripping solvent, such as the monoethanolamine wet chemical stripping solvent, intrudes into the void 17 through the seam integral thereto and upon thermal treatment of the resulting microelectronics fabrication there is formed from the void 17 a bubble 19 while simultaneously forming from the patterned second dielectric layer 16b a partially delaminated patterned second dielectric layer 16b'.

In light of the foregoing description, it is thus desirable within the art of microelectronics fabrication to develop methods and materials through which there may efficiently, economically and without delamination due to bubbles be formed residue free patterned fluorine containing plasma etched layers within microelectronics fabrications through fluorine containing plasma etching of corresponding blanket fluorine containing plasma etchable layers within those microelectronics fabrications. It is toward that goal that the present invention is generally directed.

Various methods have been disclosed in the art of microelectronics fabrication for forming residue free patterned layers within microelectronics fabrications.

For example, Wootton et al., in U.S. Pat. No. 5,496,438, discloses a method for removing a patterned photoresist etch mask layer from a patterned metal layer within an integrated circuit microelectronics fabrication in a fashion such that there is avoided corrosion induced staining of the patterned metal layer. The method employs an ashing of the patterned photoresist layer for a sufficiently long time period and at a sufficiently high temperature such that all residual corrosive gas absorbed within the patterned photoresist layer is exhausted while still maintaining thermal conditions below which the patterned metal layer begins to flow.

In addition, Langan et al., in U.S. Pat. No. 5,413,670, discloses a method for plasma etching fluorine containing plasma etchable layers from semiconductor substrate surfaces and semiconductor substrate processing reactor surfaces when fabricating integrated circuit microelectronics fabrications. The method employs a nitrogen trifluoride etchant gas in conjunction with an electropositive diluent gas at a concentration, pressure, flowrate and power optimized to obtain an optimally high etchrate of the fluorine containing plasma etchable layer while simultaneously minimizing nitrogen trifluoride consumption. Through the method there is thus obtained an optimally efficient nitrogen trifluoride fluorine containing plasma etch method at a minimum operating cost.

Finally, Nguyen et al., in U.S. Pat. No. 5,597,983, discloses a method for removing a via sidewall polymer residue formed incident to anisotropic etching of a via through a conformal dielectric layer to reach a conductor layer within a microelectronics fabrication. The method employs a tetra methyl ammonium hydroxide (TMAH) photoresist developer to remove the via sidewall polymer residue without etching the conductor layer.

It is thus desirable within the art of microelectronics fabrication to develop methods and materials through which there may efficiently, economically and without delamination due to bubbles be formed residue free patterned fluorine containing plasma etched layers from corresponding blanket fluorine containing plasma etchable layers within microelectronics fabrications. More particularly desirable are methods and materials through which there may efficiently, economically and without delamination due to bubbles be formed residue free patterned fluorine containing plasma etched dielectric layers from corresponding blanket fluorine containing plasma etchable dielectric layers within integrated circuit microelectronics fabrications. It is toward these goals that the present invention is more specifically directed.

SUMMARY OF THE INVENTION

A first object of the present invention is to provide an efficient and economical method for forming a residue free patterned fluorine containing plasma etched layer within a microelectronics fabrication.

A second object of the present invention is to provide a method in accord with the first object of the present invention, where the residue free patterned fluorine containing plasma etched layer is formed without delaminating, due to bubbles, the residue free patterned fluorine containing plasma etched layer from the microelectronics fabrication.

A third object of the present invention is to provide a method in accord with the first object of the present invention or the second object of the present invention, where the patterned fluorine containing plasma etched layer is a patterned fluorine containing plasma etched dielectric layer and the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a method for forming a patterned fluorine containing plasma etched layer within a microelectronics fabrication. To practice the method of the present invention, there is first provided a substrate employed within a microelectronics fabrication. There is then formed over the substrate a fluorine containing plasma etchable layer. There is then formed upon the fluorine containing plasma etchable layer a patterned photoresist layer. There is then etched through a fluorine containing plasma etching method while employing the patterned photoresist layer as a photoresist etch mask layer the fluorine containing plasma etchable layer to form a patterned fluorine containing plasma etched layer. The patterned fluorine containing plasma etched layer has a fluoropolymer residue layer formed thereupon. The fluorine containing plasma etch method employs a first etchant gas composition comprising a nitrogen trifluoride etchant gas. Finally, there is then stripped through an oxygen containing plasma stripping method the patterned photoresist layer and the fluoropolymer residue layer from the patterned fluorine containing plasma etched layer. The oxygen containing plasma stripping method employs a second etchant gas composition comprising a fluorine containing etchant gas and an oxygen containing etchant gas.

The present invention provides an efficient and economical method for forming a residue free patterned fluorine containing plasma etched layer within a microelectronics fabrication, where the patterned fluorine containing plasma etched layer is formed without delaminating, due to bubbles, the patterned fluorine containing plasma etched layer from the microelectronics fabrication. The present invention realizes the foregoing objects by employing within the present invention: (1) a fluorine containing etching plasma employing a first etchant gas composition comprising a nitrogen trifluoride etchant gas when forming from a fluorine containing plasma etchable layer a patterned fluorine containing plasma etched layer, where the patterned fluorine containing plasma etched layer has a fluoropolymer residue layer formed thereupon; and (2) an oxygen containing stripping plasma employing a second etchant gas composition comprising a fluorine containing etchant gas and an oxygen containing etchant gas when stripping a patterned photoresist etch mask layer and the fluoropolymer residue layer from the patterned fluorine containing plasma etched layer. While the mechanism through which the fluorine containing etching plasma and the oxygen containing stripping plasma operate to provide a residue free patterned fluorine containing plasma etched layer within a microelectronics fabrication is not clear, it is nonetheless clear that through action of the fluorine containing etching plasma and the oxygen containing stripping plasma there is provided a fluoropolymer residue layer free patterned fluorine containing plasma etched layer within a microelectronics fabrication in accord with the present invention. Since a patterned fluorine containing plasma etched layer is formed fluoropolymer residue free through the present invention, there is avoided through the present invention wet chemical stripping solvents which would otherwise be employed to strip fluoropolymer residue layers from patterned fluorine containing plasma etched layers within microelectronics fabrications.

The method of the present invention may be employed where the fluorine containing plasma etched layer is a fluorine containing plasma etched dielectric layer and the microelectronics fabrication is an integrated circuit microelectronics fabrication. The method of the present invention does not discriminate with respect to the nature of the fluorine containing plasma etched layer or nature of the microelectronics fabrication within which is formed the fluorine containing plasma etched layer. Thus, although the method of the present invention is most likely to be employed when forming patterned fluorine containing plasma etched dielectric layers within integrated circuit microelectronics fabrications, the method of the present invention may be employed in forming fluorine containing plasma etched layers of fluorine containing plasma etchable materials including but not limited to silicon oxide dielectric materials, silicon nitride dielectric materials, silicon oxynitride dielectric materials, silicon materials, tungsten materials, titanium materials and titanium nitride materials within microelectronics fabrications including but not limited to integrated circuit microelectronics fabrications, solar cell microelectronics fabrications, ceramic substrate microelectronics fabrications and flat panel display microelectronics fabrications.

The method of the present invention is readily manufacturable. The method of the present invention employs: (1) a fluorine containing etching plasma employing a first etchant gas composition comprising a nitrogen trifluoride etchant gas, followed by; (2) an oxygen containing stripping plasma employing a second etchant gas composition comprising a fluorine containing etchant gas and an oxygen containing etchant gas, to provide a residue free patterned fluorine containing plasma etched layer within a microelectronics fabrication. Since plasma etch methods and plasma stripping methods are generally known in the art of microelectronics fabrication, and it is the specific ordering of methods and materials which provides the present invention, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 to FIG. 4 show a series of schematic cross-sectional diagrams illustrating the results of progressive stages in forming within a microelectronics fabrication a delaminated patterned fluorine containing plasma etched dielectric layer in accord with a method conventional in the art of microelectronics fabrication.

DESCRIPTION OF THE PREFERRED EMBODIMENTS

Figure 5:
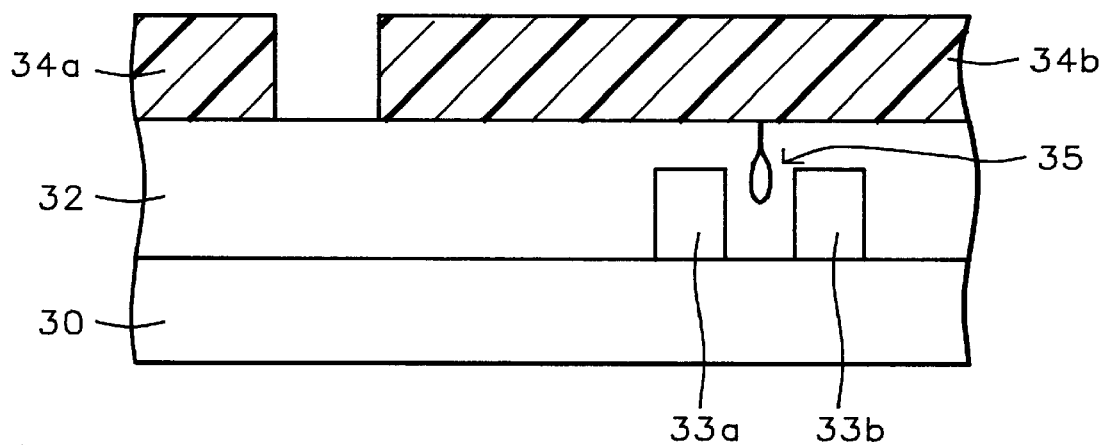
FIG. 5 to FIG. 7 show a series of schematic cross-sectional diagrams illustrating the results of progressive stages in forming within a microelectronics fabrication a residue free patterned fluorine containing plasma etched layer, without delamination, in accord with a general preferred embodiment of the present invention which comprises a first preferred embodiment of the present invention..

The present invention provides an efficient and economical method for forming a residue free patterned fluorine containing plasma etched layer within a microelectronics fabrication, where the patterned fluorine containing plasma etched layer is formed without delaminating, due to bubbles formed within the fluorine containing plasma etched layer, from the microelectronics fabrication. The method of the present invention realizes the foregoing objects by employing within the method of the present invention: (1) a fluorine containing etching plasma employing a first etchant gas composition comprising a nitrogen trifluoride etchant gas when forming from a fluorine containing plasma etchable layer within the microelectronics fabrication a patterned fluorine containing plasma etched layer, where the patterned fluorine containing plasma etched layer has a fluoropolymer residue layer formed thereupon; and (2) an oxygen containing stripping plasma employing a second etchant gas composition comprising a fluorine containing etchant gas and an oxygen containing etchant gas when stripping a patterned photoresist etch mask layer and the fluoropolymer residue layer from the patterned fluorine containing plasma etched layer. While the mechanism through which the fluorine containing etching plasma and the oxygen containing stripping plasma operate to provide the residue free patterned fluorine containing plasma etched layer within the microelectronics fabrication is not clear, it is nonetheless clear that through action of the fluorine containing etching plasma and the oxygen containing stripping plasma there is provided a fluoropolymer residue layer free patterned fluorine containing plasma etched layer within the microelectronics fabrication. Since the patterned fluorine containing plasma etched layer is formed residue free through action of the fluorine containing etching plasma and the oxygen containing stripping plasma in accord with the present invention, there is avoided through the present invention a wet chemical stripping solvent which would otherwise contribute to delamination of the patterned fluorine containing plasma etched layer from the microelectronics fabrication due to bubbles formed within the fluorine containing plasma etched layer when the wet chemical stripping solvent intrudes into voids within the patterned fluorine containing plasma etched layer and is subsequently thermally processed.

The method of the present invention does not discriminate with respect to the nature of the fluorine containing plasma etched layer or the microelectronics fabrication within which is formed the fluorine containing plasma etched layer. Thus, although the method of the present invention is most likely to be employed when forming patterned fluorine containing plasma etched dielectric layers within integrated circuit microelectronics fabrications, the method of the present invention may be employed in forming fluorine containing plasma etched layers of fluorine containing plasma etchable materials including but not limited to silicon oxide dielectric materials, silicon nitride dielectric materials, silicon oxynitride dielectric materials, silicon materials, tungsten materials, titanium materials and titanium nitride materials within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 6:
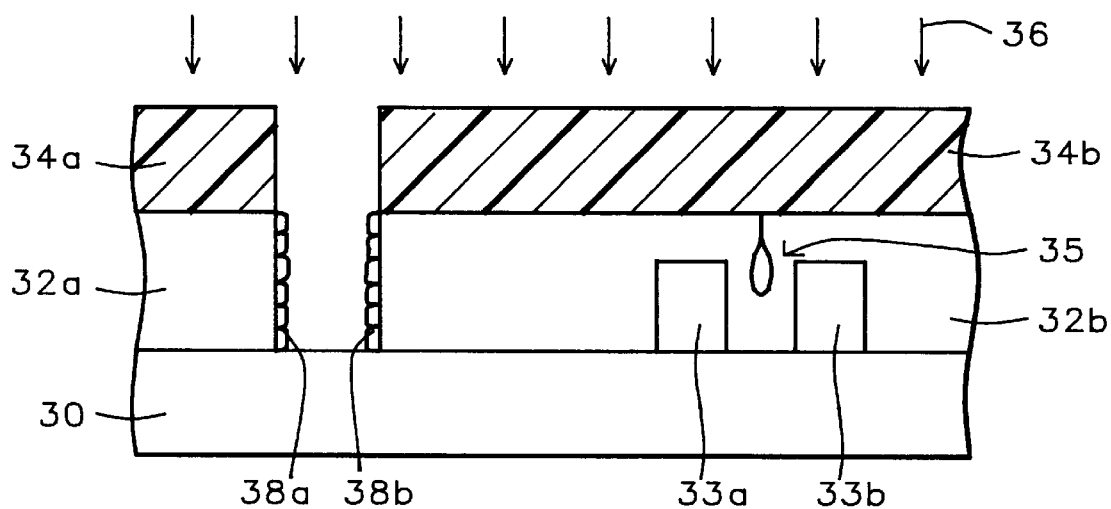
Figure 7:
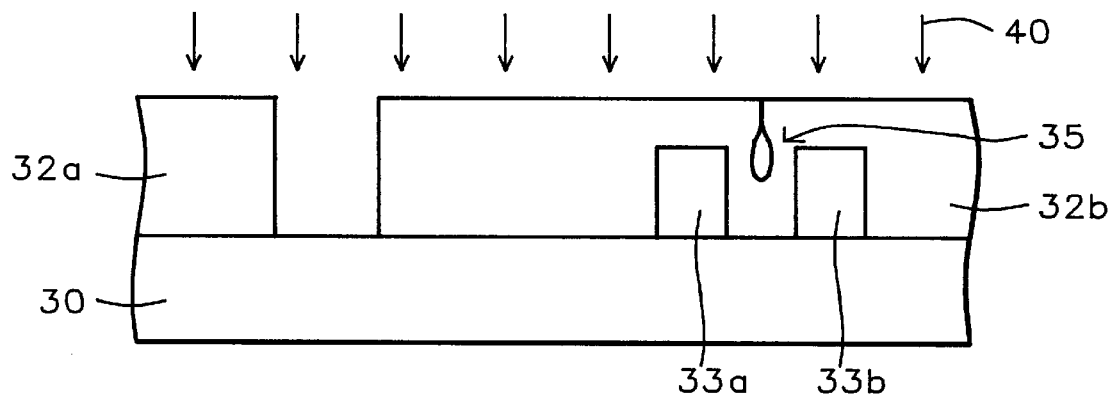

Referring now to FIG. 5 to FIG. 7, there is shown a series of schematic cross-sectional diagrams illustrating the results of progressive stages in forming within a microelectronics fabrication in accord with a general preferred embodiment of the present invention a patterned fluorine containing plasma etched layer while avoiding delamination, due to bubble formation within the patterned fluorine containing plasma etched layer, of the patterned fluorine containing plasma etched layer from the microelectronics fabrication. The general preferred embodiment of the present invention comprises a first preferred embodiment of the present invention. Shown in FIG. 5 is a schematic cross-sectional diagram of the microelectronics fabrication at an early stage in its fabrication.

Shown in FIG. 5 is a substrate 30 employed within a microelectronics fabrication, where the substrate 30 has formed thereupon a pair of microelectronics structures 33a and 33b. The substrate 30 and the pair of microelectronics structures 33a and 33b have formed thereupon a fluorine containing plasma etchable layer 32, where there is formed within the fluorine containing plasma etchable layer 32 a void 35 at a location interposed between the pair of microelectronics structures 33a and 33b. In turn, the fluorine containing plasma etchable layer 32 has formed thereupon a pair of patterned photoresist layers 34a and 34b.

Within the first preferred embodiment of the present invention, the substrate 30 may be a substrate employed within a microelectronics fabrication chosen from the group of microelectronics fabrications including but not limited to integrated circuit microelectronics fabrications, solar cell microelectronics fabrications, ceramic packaging microelectronics fabrications and flat panel display microelectronics fabrications. Similarly, the microelectronics structures 33a and 33b may be formed from microelectronics materials including but not limited to microelectronics conductor materials, microelectronics semiconductor materials and microelectronics dielectric materials. In addition, within the first preferred embodiment of the present invention, the fluorine containing plasma etchable layer 32 may be formed from a fluorine containing plasma etchable material chosen from the group of fluorine containing plasma etchable materials including but not limited to silicon oxide dielectric materials, silicon nitride dielectric materials, silicon oxynitride dielectric materials, silicon materials, tungsten materials, titanium materials and titanium nitride materials. Preferably, the fluorine containing plasma etchable layer 32 is formed to a thickness of from about 9000 to about 13000 angstroms upon the substrate 30.

Within the first preferred embodiment of the present invention, the patterned photoresist layers 34a and 34b may be formed from any of several photoresist materials as are generally known in the art of microelectronics fabrication, including photoresist materials chosen from the general groups of photoresist materials including but not limited to positive photoresist materials and negative photoresist materials. Preferably, the patterned photoresist layers 34a and 34b are formed to a thickness of from about 16000 to about 40000 angstroms upon the fluorine containing plasma etchable layer 32. Typically and preferably, the patterned photoresist layers 34a and 34b define an aperture of width from about 1.6 to about 4.0 microns.

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the fluorine containing plasma etchable layer 32 has been patterned within a fluorine containing etching plasma 36 to form the patterned fluorine containing plasma etched layers 32a and 32b. When patterning the fluorine containing plasma etchable layer 32 to form the patterned fluorine containing plasma etched layers 32a and 32b there is simultaneously formed a pair of fluoropolymer residue layers 38a and 38b upon the sidewalls of a via defined by the fluorine containing plasma etched layers 32a and 32b.

Within the first preferred embodiment of the present invention, the fluorine containing etching plasma 36 employs a first etchant gas composition comprising a nitrogen trifluoride etchant gas. Preferably, within the first preferred embodiment of the present invention the fluorine containing etching plasma 36 also employs a perfluorocarbon etchant gas (such as but not limited to a perfluorocarbon etchant gas having no greater than about four carbon atoms), a hydrofluorocarbon etchant gas (such as but not limited to a hydrofluorocarbon etchant gas having no greater than about four carbon atoms) and a sputtering gas (such as but not limited to an argon sputtering gas). Most preferably, the fluorine containing etching plasma comprises the perfluorocarbon etchant gas, the hydrofluorocarbon etchant gas, the sputtering gas and the nitrogen trifluoride etchant gas under conditions optimized to provide optimal etching of the fluorine containing plasma etchable layer 32 when forming the patterned fluorine containing plasma etched layers 32a and 32b.

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein both the patterned photoresist layers 34a and 34b, and the fluoropolymer residue layers 38a and 38b, have been stripped from the surface of the microelectronics fabrication through etching within an oxygen containing stripping plasma 40.

Within the first preferred embodiment of the present invention the oxygen containing stripping plasma 40 employs a second etchant gas composition comprising a fluorine containing etchant gas and an oxygen containing etchant gas. The fluorine containing etchant gas is preferably a perfluoro etchant gas chosen from the group of perfluoro etchant gases including but not limited to sulfur hexafluoride and perfluorocarbons having no greater than about four carbon atoms. More preferably the fluorine containing etchant gas is hexafluoroethane, although other fluorine containing etchant gases may also be employed. Similarly, within the first preferred embodiment of the present invention the oxygen containing etchant gas is selected from the from the group of oxygen containing etchant gases including but not limited to oxygen, ozone, nitrous oxide and nitric oxide. More preferably, the oxygen containing etchant gas is oxygen, although other oxygen containing etchant gases may be employed.

Upon stripping from the microelectronics fabrication whose schematic cross-sectional diagram is illustrated in FIG. 6 the patterned photoresist layers 34a and 34b and the fluoropolymer residue layers 38a and 38b within the oxygen containing stripping plasma 40 to form the microelectronics fabrication whose schematic cross-sectional diagram is illustrated in FIG. 7, there may be further fabricated the microelectronics fabrication whose schematic cross-sectional diagram is illustrated in FIG. 7 while avoiding stripping the microelectronics fabrication whose schematic cross-sectional diagram is illustrated in FIG. 7 within wet chemical strippers such as monoethanolamine strong amine based wet chemical strippers. Since there is avoided wet chemical strippers when forming the patterned fluorine containing plasma etched layers 32a and 32b within the microelectronics fabrication whose schematic cross-sectional diagram is illustrated in FIG. 7, there is also avoided delamination of the patterned fluorine containing plasma etched layer 32b from the microelectronics fabrication whose schematic cross-sectional diagram is illustrated in FIG. 7 incident to bubble formation from the void 35 when a wet chemical stripper solution intrudes into the void 35 and the microelectronics fabrication is subsequently thermally processed.

Second Preferred Embodiment

Figure 8:
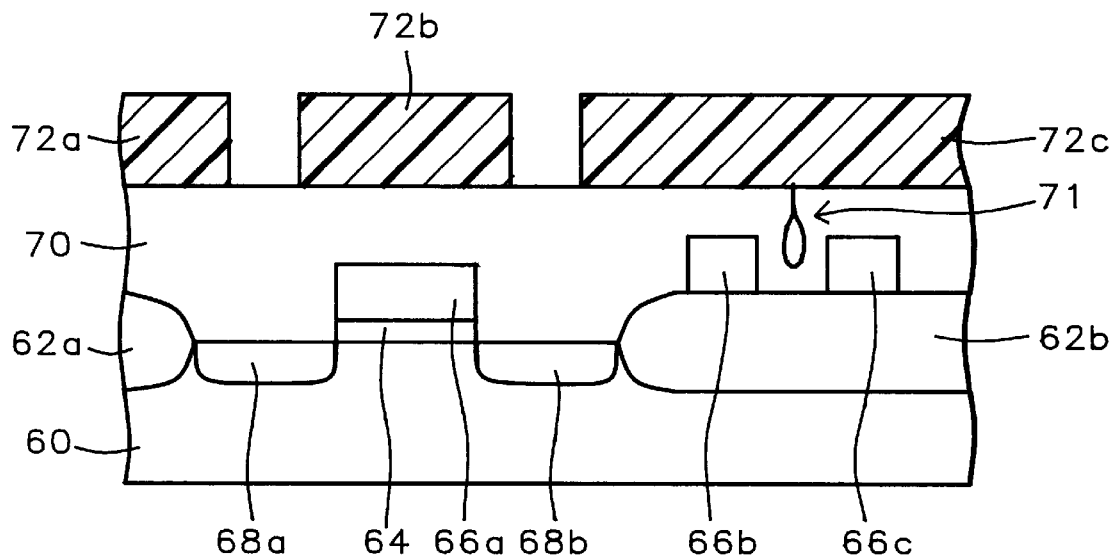
FIG. 8 to FIG. 13 show a series of schematic cross-sectional diagrams illustrating the results of progressive stages in forming within an integrated circuit microelectronics fabrication a series of patterned fluorine containing plasma etched dielectric layers, without delamination, in accord with a more specific embodiment of the present invention which comprises a second preferred embodiment of the present invention.

Referring now to FIG. 8 to FIG. 13, there is shown a series of schematic cross-sectional diagrams illustrating the results of progressive stages in forming within an integrated circuit nucroelectronics fabrication a series of patterned fluorine containing plasma etchable dielectric layers in accord with a more specific preferred embodiment of the present invention. The more specific preferred embodiment of the present invention comprises a second preferred embodiment of the present invention. Shown in FIG. 8 is a schematic cross-sectional diagram of the integrated circuit microelectronics fabrication at an early stage in its fabrication.

Shown in FIG. 8 is a semiconductor substrate 60 having formed within and upon its surface a pair of isolation regions 62a and 62b which define an active region of the semiconductor substrate 60. Although it is known in the art of integrated circuit microelectronics fabrication that semiconductor substrates are available with either dopant polarity, various dopant concentrations and several crystallographic orientations, for the second preferred embodiment of the present invention the semiconductor substrate 60 is preferably a (100) silicon semiconductor substrate having an N- or P- doping.

Similarly, although it is also known in the art of integrated circuit microelectronics fabrication that isolation regions may be formed within and/or upon semiconductor substrates through methods including but not limited to isolation region thermal growth methods and isolation region deposition/patterning methods, for the second preferred embodiment of the present invention the isolation regions 62a and 62b are preferably formed within and upon the semiconductor substrate 60 through an isolation region thermal growth method at a temperature of from about 900 to about 1150 degrees centigrade to form isolation regions 62a and 62b of silicon oxide within and upon the semiconductor substrate 60.

Shown also within FIG. 8 formed within and upon the active region of the semiconductor substrate 60 is a field effect transistor (FET) which comprise a series of structures including: (1) a gate dielectric layer 64 formed upon the active region of the semiconductor substrate 60, the gate dielectric layer 64 having formed and aligned thereupon; (2) a gate electrode 66a; and (3) a pair of source/drain regions 68a and 68b formed within the active region of the semiconductor substrate 60 at areas not covered by the gate dielectric layer 64 and the gate electrode 66. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the preferred embodiment of the present invention the gate dielectric layer 64 is preferably formed through patterning, through methods as are conventional in the art, of a blanket gate dielectric layer formed through a blanket gate dielectric layer thermal growth method at a temperature of from about 900 to about 1150 degrees centigrade to form the blanket gate dielectric layer of silicon oxide of thickness about 50 to about 150 angstroms upon the active region of the semiconductor substrate 60.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 66a is preferably formed through patterning, through methods as are conventional in the art, of a blanket layer of a doped polysilicon or polycide gate electrode material formed upon the blanket gate dielectric to a thickness of from about 1000 to about 3000 angstroms. When forming the gate electrode 66a through patterning of the blanket layer of the doped polysilicon or polycide gate electrode material, there is also formed as shown in FIG. 8 a pair of doped polysilicon or polycide interconnect layers 66b and 66c upon the isolation region 62b.

Finally, it is also known in the art of field effect transistor (FET) fabrication that source/drain regions are typically formed into active regions of a semiconductor substrate through ion implantation methods employing dopant ions of polarity opposite the polarity of the semiconductor substrate within which is formed those source/drain regions. For the preferred embodiment of the present invention, the source/drain regions 68a and 68b are preferably formed within the active region of the semiconductor substrate 60 through a high dose ion implant at an ion implant dose of from about 1E13 to about 1E15 dopant ions per square centimeter and at an ion implantation energy of from about 30 to about 150 keV while employing the gate electrode 66a and the gate dielectric layer 64 as an ion implantation mask. The high dose ion implant is of polarity appropriate to the field effect transistor (FET) and the semiconductor substrate 60.

There is also shown within FIG. 8 formed upon the semiconductor substrate 60 and the series of structures which forms the field effect transistor (FET) a planarized pre-metal dielectric (PMD) layer 70 having formed therein a first void 71 interposed between the pair of closely spaced patterned interconnect layers 66b and 66c. Methods and materials through which planarized pre-metal dielectric (PMD) layers may be formed within integrated circuit microelectronics fabrications are known in the art of integrated circuit fabrication microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the more specific preferred embodiment of the present invention, the planarized pre-metal dielectric (PMD) layer 70 is preferably formed of a silicon oxide dielectric material deposited conformally through a plasma enhanced chemical vapor deposition (PECVD) method and subsequently planrized through a chemical mechanical polish (CMP) planarizing method, as is common in the art of integrated circuit microelectronics fabrication, although other methods and materials may also be employed in forming the planarized pre-metal dielectric (PMD) layer 70. Preferably, the planarized pre-metal dielectric (PMD) layer 70 so formed is formed to a thickness of from about 7000 to about 15000 angstroms.

Finally, there is shown in FIG. 8 a series of patterned first photoresist layers 72a, 72b and 72c formed upon the planarized pre-metal dielectric (PMD) layer 70. The series of patterned first photoresist layers 72a, 72b and 72c is preferably formed through methods and materials, and to dimensions, analogous or equivalent to the methods, materials and dimensions employed in forming the patterned photoresist layers 34a and 34b within the first preferred embodiment of the present invention within the microelectronics fabrication whose schematic cross-sectional diagram is illustrated in FIG. 5.

Figure 9:
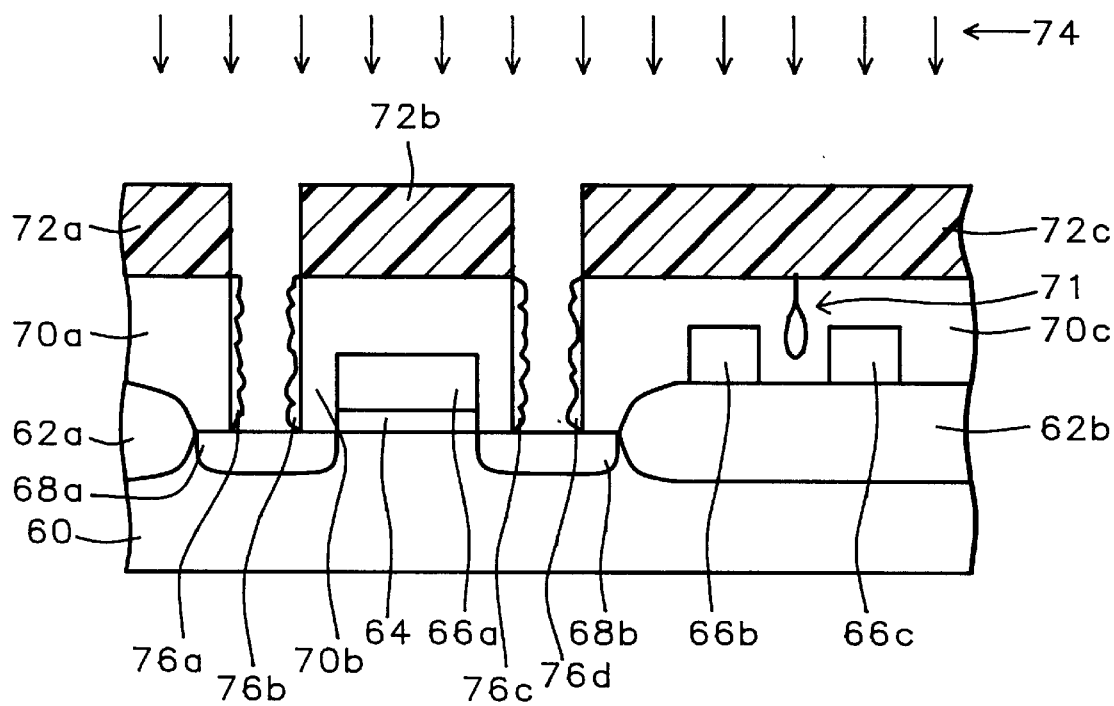

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein the planarized pre-metal dielectric (PMD) layer 70 has been patterned to form the patterned planarized pre-metal dielectric (PMD) layers 70a, 70b and 70c through etching within a first fluorine containing etching plasma 74 while employing the patterned first photoresist layers 72a, 72b and 72c as an etch mask layer. Similarly with the microelectronics fabrication whose schematic cross-sectional diagram is illustrated in FIG. 6, when etching the planarized pre-metal dielectric (PMD) layer 70 within the integrated circuit microelectronics fabrication whose schematic cross-sectional diagram is illustrated in FIG. 8 to form the patterned planarized pre-metal dielectric (PMD) layers 70a, 70b and 70c within the integrated circuit microelectronics fabrication whose schematic cross-sectional diagram is illustrated in FIG. 9 there is formed a series of first fluoropolymer residue layers 76a, 76b, 76c and 76d within the pair of vias defined by the series of patterned planarized pre-metal dielectric (PMD) layers 70a, 70b and 70c.

Within the second preferred embodiment of the present invention the methods and materials through which is formed the first fluorine containing etching plasma 74 are preferably analogous or equivalent to the methods and materials through which is formed the fluorine containing etching plasma 36 within the first preferred embodiment of the method of the present invention as illustrated within FIG. 6. Analogously with the fluorine containing etching plasma 36 employed within the first preferred embodiment of the present invention, the first fluorine containing etching plasma 74 employed within the second preferred embodiment of the present invention also employs a first etchant gas composition comprising a nitrogen trifluoride etchant gas. Preferably, within the second preferred embodiment of the present invention the first fluorine containing etching plasma 74 also employs a perfluorocarbon etchant gas (such as but not limited to a perfluorocarbon etchant gas having no greater than about four carbons atoms), a hydrofluorocarbon etchant gas (such as but not limited to a hydrofluorocarbon etchant gases having no greater than about four carbon atoms) and a sputtering gas (such as but not limited to an argon sputtering gas). More preferably, the first fluorine containing etching plasma 74 comprises the perfluorocarbon etchant gas, the hydrofluorocarbon etchant gas, the sputtering gas and the nitrogen trifluoride etchant gas under conditions optimized to provide optimal etching of the planarized pre-metal dielectric layer 70 when forming the patterned planarized pre-metal dielectric layers 70a, 70b and 70c. Most preferably, the first fluorine containing etching plasma 74 employs a carbon tetrafluoride perfluorocarbon etchant gas, a trifluoromethane hydrofluorocarbon etchant gas, an argon sputtering gas and the nitrogen trifluoride etchant gas.

Preferably, the first fluorine containing etching plasma 74 also employs: (1) a reactor chamber pressure of from about 100 to about 250 mtorr; (2) a bias power of about 800 to about 1500 watts; (3) a semiconductor substrate 60 temperature of from about 50 to about 110 degrees centigrade; (4) a carbon tetrafluoride flow rate of from about 20 to about 100 standard cubic centimeters per minute (sccm); (5) a trifluoromethane flow rate of from about 20 to about 100 standard cubic centimeters per minute (sccm); (6) an argon flow rate of from about 50 to about 200 standard cubic centimeters per minute (sccm); and (7) a nitrogen trifluoride flow rate of from about 10 to about 30 standard cubic centimeters per minute (sccm). Preferably, the planarized pre-metal dielectric (PMD) layer 70 as illustrated in FIG. 8 is patterned to yield the patterned planarized pre-metal dielectric (PMD) layers 70a, 70b and 70c as illustrated in FIG. 9 through exposure to the first fluorine containing etching plasma 74 for a time sufficient to completely reach the source/drain regions 68a and 68b.

Figure 10:
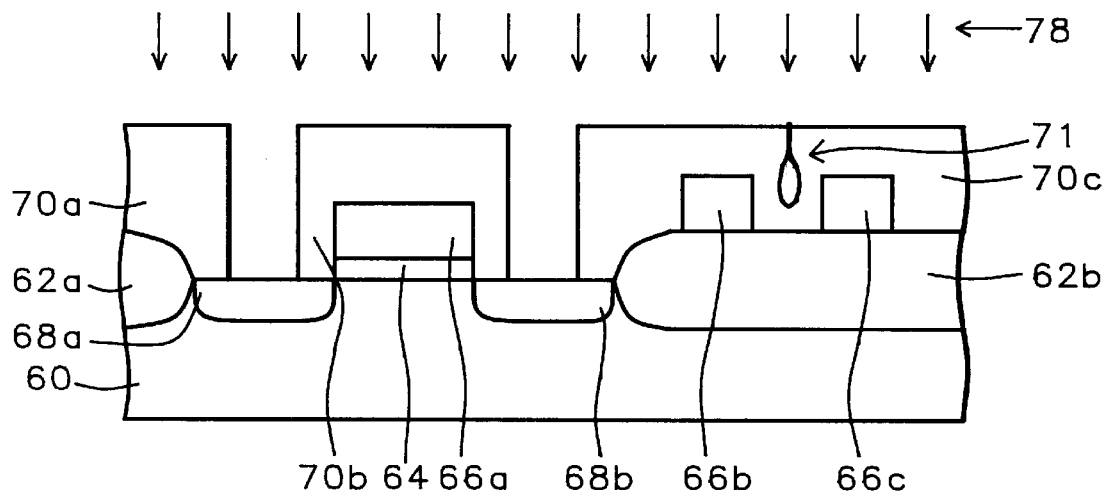

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein the patterned first photoresist layers 72a, 72b and 72c, and the first fluoropolymer residue layers 76a, 76b, 76c and 76d, have been stripped from the integrated circuit microelectronics fabrication within a first oxygen containing stripping plasma 78.

Within the second preferred embodiment of the present invention, the first oxygen containing stripping plasma 78 is preferable formed through methods and materials analogous or equivalent to the methods and materials through which is formed the oxygen containing stripping plasma 40 employed within the first preferred embodiment of the present invention as illustrated within FIG. 7. In particular, the first oxygen containing stripping plasma 78 employs a second etchant gas composition comprising a fluorine containing etchant gas and an oxygen containing etchant gas. Similarly with the first preferred embodiment of the present invention, the fluorine containing etchant gas is preferably a perfluoro etchant gas chosen from the group of perfluoro etchant gases including but not limited to sulfur hexafluoride and perfluorocarbons having no greater than about four carbon atoms. More preferably the fluorine containing etchant gas is hexafluoroethane, although other fluorine containing etchant gases may be employed. Similarly within the first preferred embodiment of the present invention, the oxygen containing etchant gas is selected from the from the group of oxygen containing etchant gases including but not limited to oxygen, ozone, nitrous oxide and nitric oxide. More preferably, the oxygen containing etchant gas is oxygen, although other oxygen containing etchant gases may be employed.

Preferably, the first oxygen containing stripping plasma 78 also employs: (1) a reactor chamber pressure of from about 5 to about 20 torr; (2) a source radio frequency power of from about 500 to about 800 watts at a source radio frequency of 13.56 MHZ; (3) a semiconductor substrate 60 temperature of from about 230 to about 270 degrees centigrade; (4) a hexafluoroethane flow rate of from about 60 to about 120 standard cubic centimeters per minute (sccm); and (5) an oxygen flow rate of from about 7000 to about 10000 standard cubic centimeters per minute (sccm).

As is illustrated in FIG. 10, the patterned photoresist layers 72a, 72b and 72c, and the first fluoropolymer residue layers 76a, 76b, 76c and 76d are completely stripped from the integrated circuit microelectronics fabrication whose schematic cross-sectional diagram is illustrated in FIG. 10 through exposure to the first oxygen containing stripping plasma 78 for a time sufficient for their complete removal. Thus, there is avoided when forming the integrated circuit microelectronics fabrication whose schematic cross-sectional diagram is illustrated in FIG. 10 the use of a stripping solvent which upon intrusion into the first void 71 and subsequent thermal processing might cause a bubble at the location of the first void 71 and consequent partial delamination of the patterned planarized pre-metal dielectric (PMD) layer 70c from the integrated circuit microelectronics fabrication whose schematic cross-sectional diagram is illustrated in FIG. 10.

Figure 11:
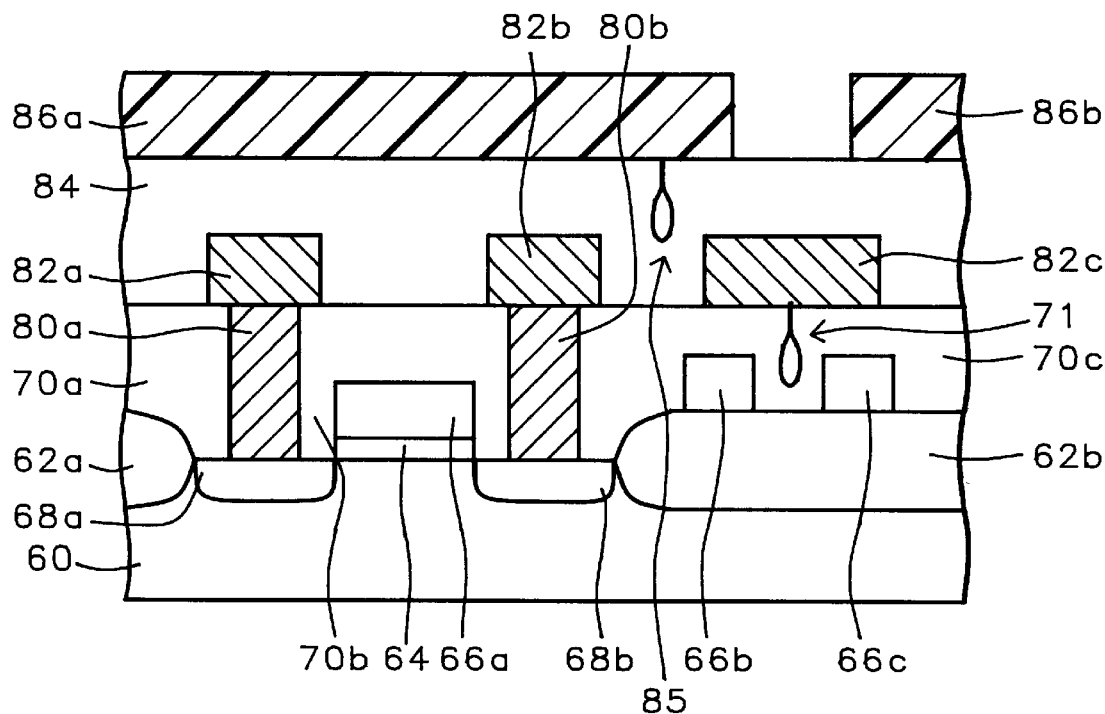

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein: (1) there is formed within the contact vias defined by the patterned planarized pre-metal dielectric (PMD) layers 70a, 70b and 70c a pair of conductive contact stud layers 80a and 80b; (2) there is formed upon the patterned planarized pre-metal dielectric (PMD) layers 70a, 70b and 70c a pair of patterned first conductor layers 82a and 82b contacting the corresponding conductive contact studs 80a and 80b, along with a patterned first conductor layer 82c; (3) there is formed upon the patterned planarized pre-metal dielectric layers 70a, 70b and 70c, including the patterned first conductor layers 82a, 82b and 82c an inter-metal dielectric (IMD)/passivation layer 84 having formed therein a second void 85 interposed between the patterned second conductor layers 82b and 82c; and (4) there is formed upon the inter-metal dielectric (IMD)/passivation layer 84 a pair of patterned second photoresist layers 86a and 86b.

Each of the foregoing layers may be formed through methods and materials as are conventional in the art of integrated circuit microelectronics fabrication.

For example, although it is known in the art of integrated circuit microelectronics fabrication that conductive contact stud layers may be formed through methods and materials including but not limited to thermally assisted evaporation methods, electron beam assisted evaporation methods, chemical vapor deposition methods and physical vapor deposition (PVD) sputtering methods through which may be formed conductive contact stud layers of conductive materials including but not limited to metals, metal alloys, doped polysilicon and polycides (doped polysilicon/metal silicide stacks), for the second preferred embodiment of the present invention the pair of conductive contact stud layers 80a and 80b is preferably formed, at least in part, of tungsten metal deposited through a chemical vapor deposition (CVD) method, as is common in the art of integrated circuit microelectronics fabrication. Preferably, the conductive contact stud layers 80a and 80b are formed to a thickness sufficient to reach the surfaces of the patterned planarized pre-metal dielectric (PMD) layers 70a, 70b and 70c.

Similarly, although it is also known in the art of integrated circuit microelectronics fabrication that patterned conductor layers may be formed through methods and materials including but not limited to thermally assisted evaporation methods, electron beam assisted evaporation methods, chemical vapor deposition (CVD) methods and physical vapor deposition PVD) sputtering methods through which may be formed patterned conductor layers of conductor materials including but not limited to metals, metal alloys, doped polysilicon and polycides, for the second preferred embodiment of the present invention, the patterned first conductor layers 82a, 82b and 82c are preferably formed at least in part of an aluminum containing conductor material, as is similarly common in the art of integrated circuit microelectronics fabrication. Preferably, the patterned first conductor layers are formed to a thickness of from about 3500 to about 6000 angstroms.

With respect to the inter-metal dielectric (IMD)/passivation layer 84, the inter-metal dielectric (IMD)/passivation layer 84 is preferably formed through methods and materials, and to dimensions, analogous to the methods, materials and dimensions employed in forming the planarized pre-metal dielectric (IMD) layer 70 as illustrated in FIG. 8, with the exception that the inter-metal dielectric (IMD)/passivation layer 84 when employed as a passivation layer (ie: final dielectric layer formed within an integrated circuit microelectronics fabrication) is typically not planarized although the inter-metal dielectric (IMD)/passivation layer 84 when formed as an inter-metal dielectric (IMD) layer (ie: interposed between successive patterned metal layers within an integrated circuit microelectronics fabrication (not completely shown in FIG. 11 but understood by a person skilled in the art to be consistent with that which is shown in FIG. 11)) the inter-metal dielectric (IMD)/passivation layer 84 is typically planarized. Generally, the inter-metal dielectric (IMD)/passivation layer 84 when formed as a passivation layer is more likely to be formed as a silicon nitride or a silicon oxynitride layer, although when formed as an inter-metal dielectric layer the inter-metal dielectric (IMD)/passivation layer 84 is more likely to be formed as a silicon oxide layer.

Finally, the patterned second photoresist layers 86a and 86b are preferably formed through methods and materials, and to dimensions, analogous or equivalent to the methods, materials and dimensions employed in forming the patterned first photoresist layers 72a, 72b and 72c within the integrated circuit microelectronics fabrication whose schematic cross-sectional diagram is illustrated in FIG. 8.

Figure 12:
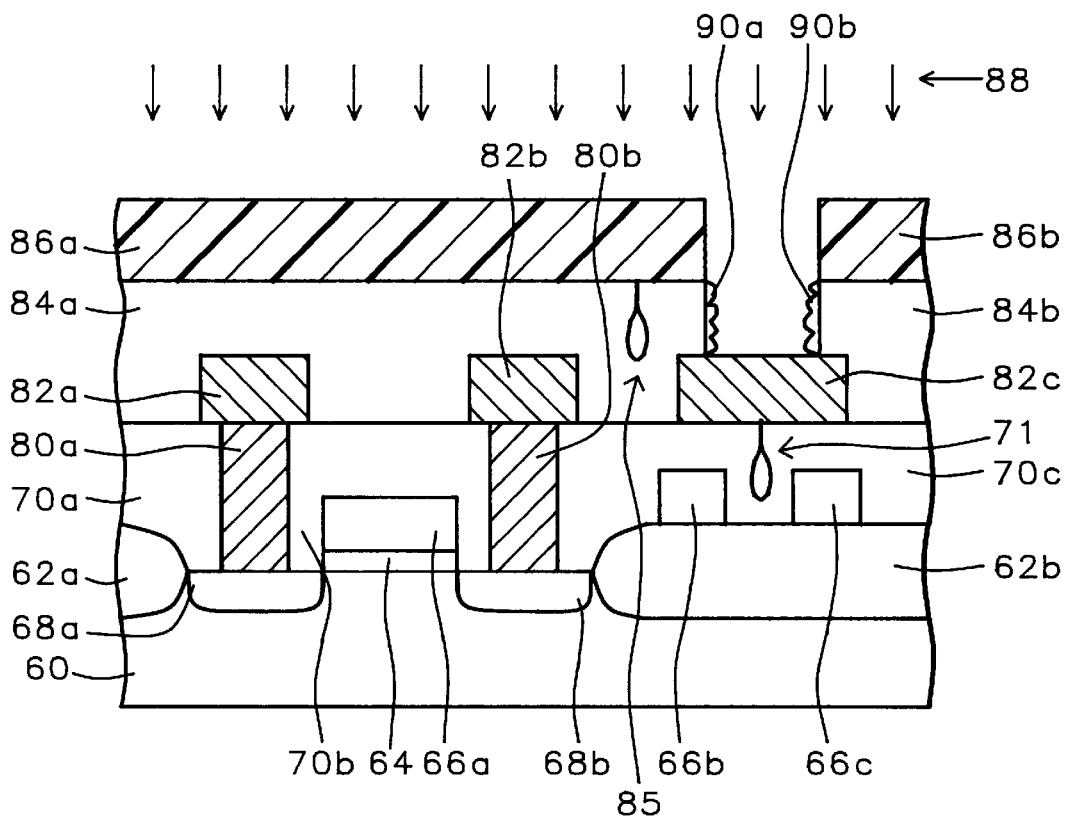

Referring now to FIG. 12, there is shown a schematic cross-sectional diagram illustrating the results of further processing of the integrated circuit microelectronics fabrication whose schematic cross-sectional diagram is illustrated in FIG. 11. Shown in FIG. 12 is a schematic cross-sectional diagram of an integrated circuit microelectronics fabrication otherwise equivalent to the integrated circuit microelectronics fabrication whose schematic cross-sectional diagram is illustrated in FIG. 11, but wherein the inter-metal dielectric (IMD)/passivation layer 84 has been patterned to form the patterned inter-metal dielectric (IMD)/passivation layers 84a and 84b through etching within a second fluorine containing etching plasma 88. When etching the inter-metal dielectric (IMD)/passivation layer 84 to form the patterned inter-metal dielectric (IMD)/passivation layers 84a and 84b, there is formed the second fluoropolymer residue layers 90a and 90b upon the sidewalls of the patterned inter-metal dielectric (IMD)/passivation layers 84a and 84b which define an interconnection via or a terminal via. Within the second preferred embodiment of the present invention, the second fluorine containing etching plasma 88 is formed through methods and materials analogous or equivalent to the methods and materials employed in forming the first fluorine containing etching plasma 74 as illustrated within the schematic cross-sectional diagram of FIG. 9.

Figure 13:
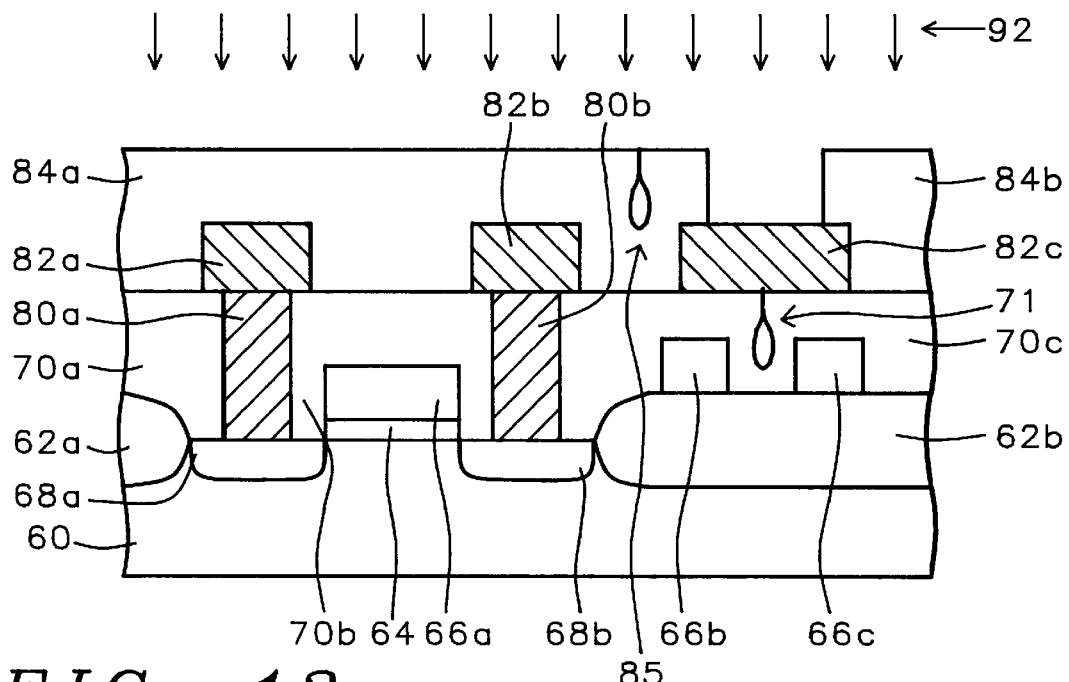

Referring now to FIG. 13, there is shown a schematic cross-sectional diagram illustrating the results of further processing of the integrated circuit microelectronics fabrication whose schematic cross-sectional diagram is illustrated in FIG. 12. Shown in FIG. 13 is a schematic cross-sectional diagram of an integrated circuit microelectronics fabrication otherwise equivalent to the integrated circuit microelectronics fabrication whose schematic cross-sectional diagram is illustrated in FIG. 12, but wherein the patterned second photoresist layers 86a and 86b, and the second fluoropolymer residue layers 90a and 90b, have been stripped from integrated circuit microelectronics fabrication through etching within a second oxygen containing stripping plasma 92. Within the second preferred embodiment of the present invention, the second oxygen containing stripping plasma 92 is preferably formed through methods and materials analogous or equivalent to the methods and materials employed in forming the first oxygen containing stripping plasma 78 as illustrated in FIG. 10.

As is illustrated in FIG. 13, through etching within the second oxygen containing stripping plasma 92 the patterned second photoresist layers 84a and 84b, and the second fluoropolymer residue layers 90a and 90b, are completely stripped from the integrated circuit microelectronics fabrication whose schematic cross-sectional diagram is illustrated in FIG. 12 to provide the integrated circuit microelectronics fabrication whose schematic cross-sectional diagram is illustrated in FIG. 13. Thus, the integrated circuit microelectronics fabrication whose schematic cross-sectional diagram is illustrated in FIG. 13 may be further fabricated into an integrated circuit while avoiding wet chemical stripping solvents in forming the integrated circuit microelectronics fabrication whose schematic cross-sectional diagram is illustrated in FIG. 13. Since there may be avoided wet chemical stripping solvents when forming the integrated circuit microelectronics fabrication whose schematic cross-sectional diagram is illustrated in FIG. 13, there is also avoided intrusion of a wet chemical solvent into the second void 85 which upon subsequent thermal treatment of the integrated circuit microelectronics fabrication whose schematic cross-sectional diagram is illustrated in FIG. 13 might lead to bubble formation from the second void 85 and partial delamination of the patterned inter-metal dielectric (IMD)/passivation layer 84a from the integrated circuit microelectronics fabrication whose schematic cross-sectional diagram is illustrated in FIG. 13.

EXAMPLES

Upon each semiconductor substrate within two series of semiconductor substrates was formed an integrated circuit microelectronics fabrication structure comprising a series of patterned aluminum containing conductor layer bond pads having formed thereupon a composite silicon oxide/silicon nitride passivation layer. The composite silicon oxide/silicon nitride passivation layer employed a silicon oxide layer of thickness about 2000 angstroms formed through a plasma enhanced chemical vapor deposition (PECVD) method employing silane as a silicon source material having formed thereupon a silicon nitride layer of thickness about 7000 angstroms similarly formed through a plasma enhanced chemical vapor deposition (PECVD) method. In turn each composite silicon oxide/silicon nitride passivation layer had formed thereupon a patterned photoresist layer exposing portions of the composite silicon oxide/silicon nitride passivation layer through which vias were to be formed accessing the patterned aluminum containing conductor layer bond pads. The patterned aluminum containing conductor layer bond pads, the composite silicon oxide/silicon nitride passivation layers and the patterned photoresist layers were formed through methods as are otherwise conventional in the art of integrated circuit microelectronics fabrication.

Within each of the semiconductor substrates, the patterned aluminum containing conductor layer bond pads were formed of a thickness about 8000 angstroms and of areal dimensions about 15 microns by about 15 microns over the semiconductor substrate. As noted above, the composite silicon oxide/silicon nitride passivation layers were each formed to a thickness about 9000 angstroms. The patterned photoresist layers were each formed to a thickness of from about 35000 angstroms from a JSR positive photoresist material available from JSR Company, Japan.

The composite silicon oxide/silicon nitride passivation layers upon a first series of the two series of semiconductor substrates was then etched within a fluorine containing etching plasma as is conventional in the art, employing an etchant gas composition comprising carbon tetrafluoride, trifluoromethane, argon and sulfur hexafluoride, to form a patterned composite silicon oxide/silicon nitride passivation layer defining terminal vias of areal dimensions about 15 microns by about 15 microns which exposed the patterned aluminum containing bond pad layers. Formed upon the terminal via sidewalls were fluorocarbon polymer residue layers. The fluorine containing etching plasma was formed within an Applied Materials MxP+ brand tool which also employed: (1) a reactor chamber pressure of from about 150 mtorr; (2) a source radio frequency power of about 0 watts at a source radio frequency of 13.56 MHZ; (3) a bias power of about 1100 watts; (4) a semiconductor substrate temperature of about 80 degrees centigram; (5) a carbon tetrafluoride flow rate of about 20 standard cubic centimeters per minute (sccm); (6) a trifluoromethane flow rate of about 60 standard cubic centimeters per minute (sccm); (7) an argon flow rate of about 100 standard cubic centimeters per minute (sccm); and (8) a sulfur hexafluoride flow rate of about 10 standard cubic centimeters per minute.

The patterned photoresist layers were then stripped from the patterned composite silicon oxide/silicon nitride passivation layers through an oxygen containing stripping plasma as is similarly conventional in the art of integrated circuit microelectronics fabrication. The oxygen containing stripping plasma comprised an oxygen etchant gas. The oxygen containing stripping plasma was formed with a Mattson brand tool which also employed: (1) a reactor chamber pressure of about 6 torr; (2) a source radio frequency power of about 640 watts at a source radio frequency of 13.56 MHZ (without a bias power); (3) a semiconductor substrate temperature of about 250 degrees centigrade; and (4) an oxygen flow rate of about 8000 standard cubic centimeters per minute (sccm).

Finally, the fluoropolymer residue layers which remained within the terminal vias through the composite silicon oxide/silicon nitride passivation layers were stripped from the semiconductor substrates through immersion within a stripping solvent comprised of monoethanolamine available as ACT or EKC stripper from Ashland Chemical Technology, Inc. or EKC Technology Inc.

The composite silicon oxide/silicon nitride passivation layers upon the second series of the two series of semiconductor substrates were treated similarly to the composite silicon oxide/silicon nitride passivation layers upon the first series of the two series of semiconductor substrates, but with the following three exceptions. First, the fluorine containing etching plasma had incorporated therein a nitrogen trifluoride etchant gas at a flow rate of about 10 standard cubic centimeters per minute (sccm) in place of the sulfur hexafluoride etchant gas at the flow rate of about 10 standard cubic centimeters per minute (sccm). Second, the oxygen containing stripping plasma had incorporated therein a hexafluoroethane etchant gas at a flow rate of about 80 standard cubic centimeters per minute (sccm) in addition to the oxygen etchant gas at the flow rate of about 8000 standard cubic centimeters per minute. Finally, there was not employed the monoethanolamine stripping solvent within the second series of semiconductor substrates. The fluoropolymer residue layers were completely stripped with the patterned photoresist layers from the second series of semiconductor substrates through this method without the use of the monoethanolamine stripping solvent.

The two series of semiconductor substrates were then inspected for bubbles beneath the silicon oxynitride passivation layers near the terminal vias accessing the patterned aluminum containing conductor bond pad layers. Inspections were undertaken employing an optical microscope. The results of the inspections are shown below in Table I.

TABLE I

| Fluorine Etch Method | Oxygen Strip Method | Wet Strip | Bubbles |
| --- | --- | --- | --- |
| CF4, CHF3, Ar, SF6 | O2 only | yes | yes |
| CF4, CHF3, Ar, NF3 | O2, C2F6 | no | no |

As is seen from review of the data in Table I, a substantial reduction in bubbles is observed when etching a composite silicon oxide/silicon nitride passivation layer in accord with the method of the present invention and subsequently simultaneously stripping therefrom a patterned photoresist etch mask layer and fluoropolymer residue layers in accord with the method of the present invention, in comparison within a sequential fluorine containing plasma etching method, oxygen containing plasma stripping method and monoethanolamine wet chemical stripping method as is convention in the art of integrated circuit microelectronics fabrication.

As is understood by a person skilled in the art, the preferred embodiments and examples of the present invention are illustrative of the present invention rather than limiting of the present invention. Revisions and modifications may be made to methods, materials, structures and dimensions through which are fabricated microelectronics fabrications in accord with the preferred embodiments and examples of the present invention while still providing microelectronics fabrications which are fabricated in accord with the present invention, as defined by the appended claims.

What is claimed is:

1. A method for forming a patterned fluorine containing plasma etched layer within a microelectronics fabrication comprising:

providing a substrate employed within a microelectronics fabrication;

forming over the substrate a fluorine containing plasma etchable layer;

forming upon the fluorine containing plasma etchable layer a patterned photoresist layer;

etching through use of a fluorine containing plasma etching method while employing the patterned photoresist layer as a photoresist etch mask layer the fluorine containing plasma etchable layer to form a patterned fluorine containing plasma etched layer, the patterned fluorine containing plasma etched layer having a fluoropolymer residue layer formed thereupon, the fluorine containing plasma etch method employing a first etchant gas composition comprising a perfluorocarbon etchant gas, a hydrofluorocarbon etchant gas, a sputtering gas and a nitrogen trifluoride etchant gas; and stripping through use of an oxygen containing plasma stripping method the patterned photoresist layer and the fluoropolymer residue layer from the patterned fluorine containing plasma etched layer, the oxygen containing plasma stripping method employing a second etchant gas composition comprising a fluorine containing etchant gas and an oxygen containing etchant gas.

2. The method of claim 1 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

3. The method of claim 1 wherein the fluorine containing plasma etchable layer is formed from a fluorine containing plasma etchable material selected from the group of fluorine containing plasma etchable materials consisting of silicon oxide dielectric materials, silicon nitride dielectric materials, silicon oxynitride dielectric materials, silicon materials, tungsten materials, titanium materials, and titanium nitride materials.

4. The method of claim 1 wherein the first etchant gas composition comprises a carbon tetrafluoride perfluorocarbon etchant gas, a trifluoromethane hydrofluorocarbon etchant gas, an argon sputtering gas and the nitrogen trifluoride etchant gas.

5. The method of claim 1 wherein the second etchant gas composition comprises a perfluorocarbon etchant gas and an oxygen etchant gas.

6. The method of claim 5 wherein the second etchant gas composition comprises a hexafluoroethane perfluorocarbon etchant gas and the oxygen etchant gas.

7. A microelectronics fabrication having formed therein a fluorine containing plasma etched layer formed in accord with the method of claim 1.

8. A method for forming a patterned fluorine containing plasma etched dielectric layer within a microelectronics fabrication comprising:

providing a substrate employed within a microelectronics fabrication;

forming over the substrate a fluorine containing plasma etchable dielectric layer;

forming upon the fluorine containing plasma etchable dielectric layer a patterned photoresist layer;

etching through use of a fluorine containing plasma etching method while employing the patterned photoresist layer as a photoresist etch mask layer the fluorine containing plasma etchable dielectric layer to form a patterned fluorine containing plasma etched dielectric layer, the patterned fluorine containing plasma etched dielectric layer having a fluoropolymer residue layer formed thereupon, the fluorine containing plasma etch method employing a first etchant gas composition comprising a perfluorocarbon etchant gas, a hydrofluorocarbon etchant gas, a sputtering gas and a nitrogen trifluoride etchant gas; and stripping through use of an oxygen containing plasma stripping method the patterned photoresist layer and the fluoropolymer residue layer from the patterned fluorine containing plasma etched dielectric layer, the oxygen containing plasma stripping method employing a second etchant gas composition comprising a fluorine containing etchant gas and an oxygen containing etchant gas.

9. The method of claim 8 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

10. The method of claim 8 wherein the fluorine containing plasma etchable dielectric layer is formed from a fluorine containing plasma etchable dielectric material selected from the group of fluorine containing plasma etchable dielectric materials consisting of silicon oxide dielectric materials, silicon nitride dielectric materials and silicon oxynitride dielectric materials.

11. The method of claim 8 wherein the first etchant gas composition comprises a carbon tetrafluoride perfluorocarbon etchant gas, a trifluoromethane hydrofluorocarbon etchant gas, an argon sputtering gas and the nitrogen trifluoride etchant gas.

12. The method of claim 8 wherein the second etchant gas composition comprises a perfluorocarbon etchant gas and an oxygen etchant gas.

13. The method of claim 12 wherein the second etchant gas composition comprises a hexafluoroethane perfluorocarbon etchant gas and the oxygen etchant gas.

14. A microelectronics fabrication having formed therein a fluorine containing plasma etched dielectric layer formed in accord with the method of claim 8.

* * * * *